United States Patent
Haneda

(10) Patent No.: US 9,141,455 B2
(45) Date of Patent: Sep. 22, 2015

(54) BIT PATTERN DATA CONVERTING METHOD AND APPARATUS THEREFOR

(71) Applicant: FUJITSU LIMITED, Kawasaki-shi (JP)

(72) Inventor: Terumasa Haneda, Machida (JP)

(73) Assignee: FUJITSU LIMITED, Kawasaki (JP)

( * ) Notice: Subject to any disclaimer, the term of this patent is extended or adjusted under 35 U.S.C. 154(b) by 268 days.

(21) Appl. No.: 13/855,000

(22) Filed: Apr. 2, 2013

(65) Prior Publication Data

US 2014/0006884 A1 Jan. 2, 2014

(30) Foreign Application Priority Data

Jun. 29, 2012 (JP) ................................. 2012-147390

(51) Int. Cl.
*G06F 11/00* (2006.01)
*H03M 13/27* (2006.01)
*H03M 13/29* (2006.01)

(52) U.S. Cl.
CPC ............ *G06F 11/006* (2013.01); *G06F 11/004* (2013.01); *H03M 13/27* (2013.01); *H03M 13/2957* (2013.01)

(58) Field of Classification Search
CPC .............................. G06F 11/006; G06F 11/1072
See application file for complete search history.

(56) References Cited

U.S. PATENT DOCUMENTS

| 6,563,895 | B2 * | 5/2003 | Barry et al. | 375/355 |
| 6,941,412 | B2 | 9/2005 | Gongwer et al. | |
| 7,266,026 | B2 | 9/2007 | Gongwer et al. | |
| 7,353,438 | B2 * | 4/2008 | Leung et al. | 714/720 |
| 8,705,603 | B2 * | 4/2014 | Coe et al. | 375/232 |
| 2002/0188798 | A1 | 12/2002 | Kumaki et al. | |
| 2008/0031042 | A1 | 2/2008 | Eran | |
| 2008/0056017 | A1 | 3/2008 | Suzuki et al. | |

FOREIGN PATENT DOCUMENTS

| JP | 2002-366419 | 12/2002 |
| JP | 2005-537551 | 12/2005 |
| JP | 2008-59449 | 3/2008 |
| JP | 2010-528380 | 8/2010 |
| KR | 10-2009-0041400 A | 4/2009 |
| WO | WO-2004/021576 | 3/2004 |
| WO | WO-2008/145070 | 12/2008 |

OTHER PUBLICATIONS

Korean Office Action mailed May 29, 2014 for corresponding Korean Patent Application 10-2013-0032654, with English Translation, 8 pages.

* cited by examiner

*Primary Examiner* — Esaw Abraham
(74) *Attorney, Agent, or Firm* — Fujitsu Patent Center

(57) ABSTRACT

A data converting method includes counting for each bit pattern among bit patterns that a data segment of a specific number of bits can assume, the number of data segments that have the bit pattern, where the data segments are segments of write_data written to a storage medium storing two types of bit values among which a first value has a higher error occurrence rate than a second value; correlating a bit pattern selected as a conversion source pattern, from among the bit patterns in descending order of count results, with a bit pattern selected as a conversion target pattern, from among the bit patterns in descending order of quantities of the second value respectively included in the bit patterns; and converting for each conversion source bit pattern, data segments having the conversion source bit pattern, into converted data segments having the correlated conversion target bit pattern.

14 Claims, 12 Drawing Sheets

| COUNTER ID | COUNTER VALUE |
|---|---|
| C1 | 0x264 |
| C2 | 0x02F |
| C3 | 0xB61 |
| C4 | 0x000 |
| C5 | 0xFC1 |
| C6 | 0x000 |
| C7 | 0x000 |
| C8 | 0x000 |
| C9 | 0x021 |
| C10 | 0x000 |
| C11 | 0x211 |
| C12 | 0x000 |
| C13 | 0x000 |
| C14 | 0x000 |
| C15 | 0x000 |
| C16 | 0x019 |

COUNTER TABLE ~500

| ENTRY NUMBER | CONVERSION SOURCE PATTERN | CONVERSION TARGET PATTERN |
|---|---|---|
| 1 | | 0xF |
| 2 | | 0xE |
| 3 | | 0xD |
| 4 | | 0xB |
| 5 | | 0x7 |
| 6 | | 0xC |
| 7 | | 0x6 |
| 8 | | 0x3 |
| 9 | | 0x9 |
| 10 | | 0xA |
| 11 | | 0x5 |
| 12 | | 0x8 |
| 13 | | 0x4 |
| 14 | | 0x2 |
| 15 | | 0x1 |
| 16 | | 0x0 |

CONVERSION TABLE 600

FIG.9A

CONVERSION TABLE ~600

| ENTRY NUMBER | CONVERSION SOURCE PATTERN | CONVERSION TARGET PATTERN |
|---|---|---|
| 1 | | 0xF |
| 2 | | 0xE |
| 3 | | 0xD |
| 4 | | 0xB |
| 5 | | 0x7 |
| 6 | | 0xC |
| 7 | | 0x6 |
| 8 | | 0x3 |
| 9 | | 0x9 |
| 10 | | 0xA |
| 11 | | 0x5 |
| 12 | | 0x8 |
| 13 | | 0x4 |
| 14 | | 0x2 |
| 15 | | 0x1 |
| 16 | | 0x0 |

FIG.9B

| ENTRY NUMBER | CONVERSION SOURCE PATTERN | CONVERSION TARGET PATTERN |
|---|---|---|
| 1 | 0x8 | 0xF |
| 2 | 0x2 | 0xE |
| 3 | 0x0 | 0xD |
| 4 | 0x3 | 0xB |
| 5 | 0x1 | 0x7 |
| 6 | 0x6 | 0xC |
| 7 | 0x7 | 0x6 |
| 8 | | 0x3 |
| 9 | | 0x9 |
| 10 | | 0xA |
| 11 | | 0x5 |
| 12 | | 0x8 |
| 13 | | 0x4 |
| 14 | | 0x2 |
| 15 | | 0x1 |
| 16 | | 0x0 |

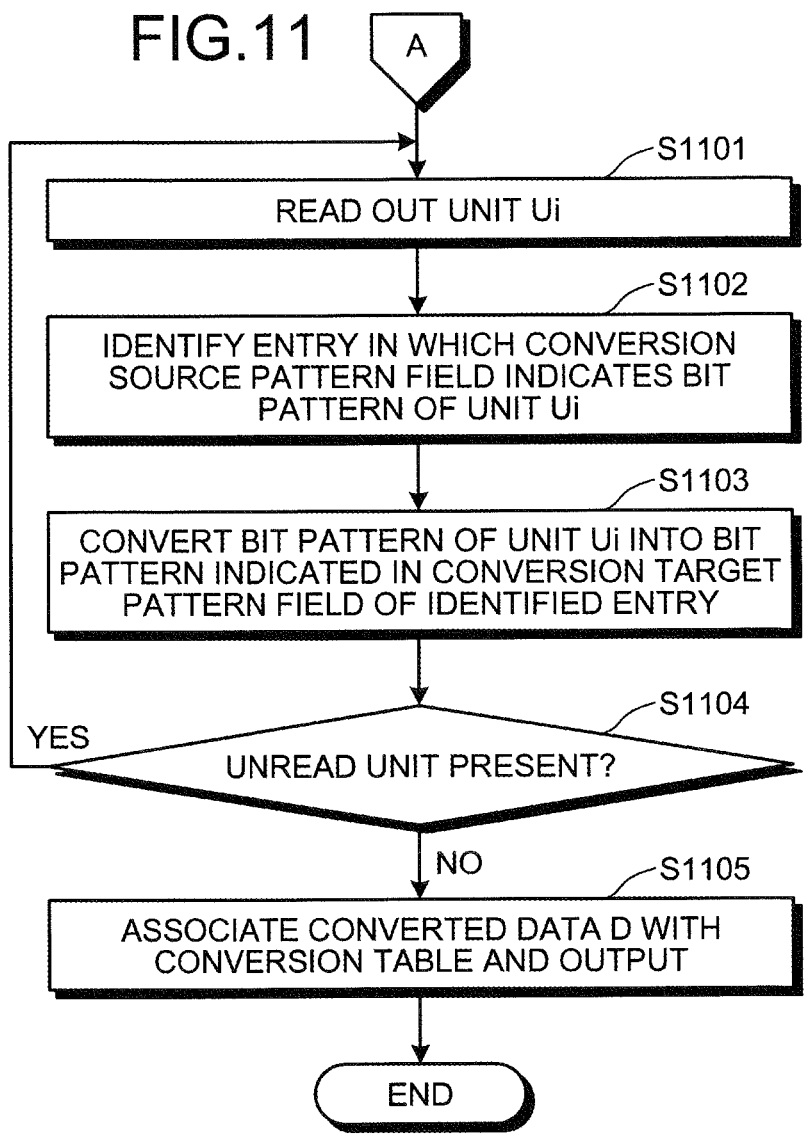

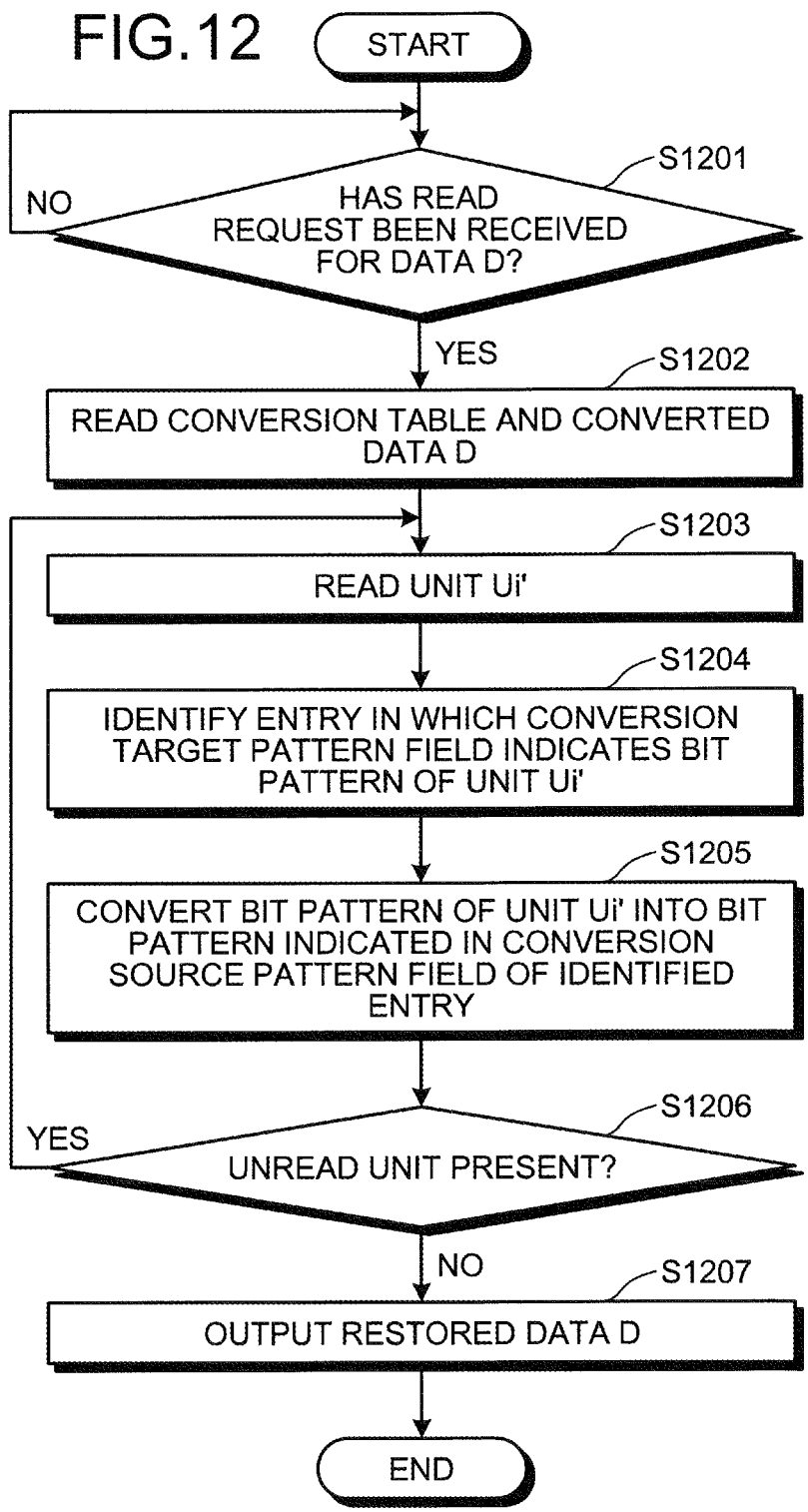

BIT PATTERN DATA CONVERTING METHOD AND APPARATUS THEREFOR

CROSS REFERENCE TO RELATED APPLICATIONS

This application is based upon and claims the benefit of priority of the prior Japanese Patent Application No. 2012-147390, filed on Jun. 29, 2012, the entire contents of which are incorporated herein by reference.

FIELD

The embodiments discussed herein are related to data conversion.

BACKGROUND

A technique called error check and correct (ECC) is a conventional method for lowering the error rate of semiconductor memory, such as NAND-type flash memory. ECC is a technique in which a memory controller adds error correction code to data when the data is written to the semiconductor memory, whereby errors are corrected by the error correction code when the data is read.

Related prior techniques includes, for example, a technique such that when data is written to a flash memory, the data is encoded, the number of specific numerical values in the encoded data is reduced to be smaller than the number of specific numerical values before the encoding, and then the encoded data is written to a memory cell of the flash memory. Another related technique is a technique in which information is converted from information of a first data format into information of a second data format using statistical values related to the first data format and the information is stored to memory together with an identifier for identifying a conversion value used for conversion to the second data format.

Still another related technique is a technique in which data is written to random access memory, is converted into data in which the number of bits having a prescribed value is greater than or equal to a prescribed number and the converted data is output to the random access memory. Still another related technique is a technique such that among n kinds of write_data created by rearranging write_data in burst transmission, write_data having less data switching at data writing to memory than data switching before the rearrangement in burst transmission is selected and the order of the selected write_data in burst transmission is encoded in a redundant bit.

For examples of the conventional techniques above, refer to Published Japanese-Translations of PCT Application, Publication Nos. 2010-528380 and 2005-537551, and Japanese Laid-Open Patent Publication Nos. 2002-366419 and 2008-059449.

As the semi-conductor memory comes to have a microfabricated structure or multivalued configuration, the error rate of the semi-conductor memory increases. As a result, error correction using conventional techniques, such as ECC, has become difficult. For example, a higher error rate of the semi-conductor memory results in an increase in the number of bits of the error correction code used in ECC, thus leading to increased circuit scale of the memory controller and a larger required memory capacity of the semi-conductor memory.

SUMMARY

According to an aspect of an embodiment, a data converting method executed by a computer includes counting for each bit pattern that appears in a group of data segments and is among a group of bit patterns that a bit string of a specific number of bits can assume, the number of data segments in the group of data segments, having the bit pattern, the group of data segments being created by segmenting write_data by the specific number of bits, the write_data being written to a storage medium having a property that among two types of bit values stored in the storage medium, a first value has a bit error occurrence rate that is higher than that of a second value; correlating a bit pattern that is selected as a conversion source pattern, from the group of bit patterns in descending order of count results obtained at the counting, with a bit pattern that is selected as a conversion target pattern, from the group of bit patterns in descending order of quantities of the second value included in the bit patterns, respectively; and converting for each conversion source bit pattern, data segments included in the group of data segments and having the conversion source bit pattern, into converted data segments having the conversion target bit pattern correlated with the conversion source bit pattern.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 9A and 9B are explanatory diagrams of an example of making the conversion table 600;

FIGS. 10 and 11 are flowcharts of an example of a writing procedure by the NAND controller 302; and FIG. 12 is a flowchart of an example of a reading procedure by the NAND controller 302.

DESCRIPTION OF EMBODIMENTS

Preferred embodiments of the present invention will be explained with reference to the accompanying drawings.

Figure 1:
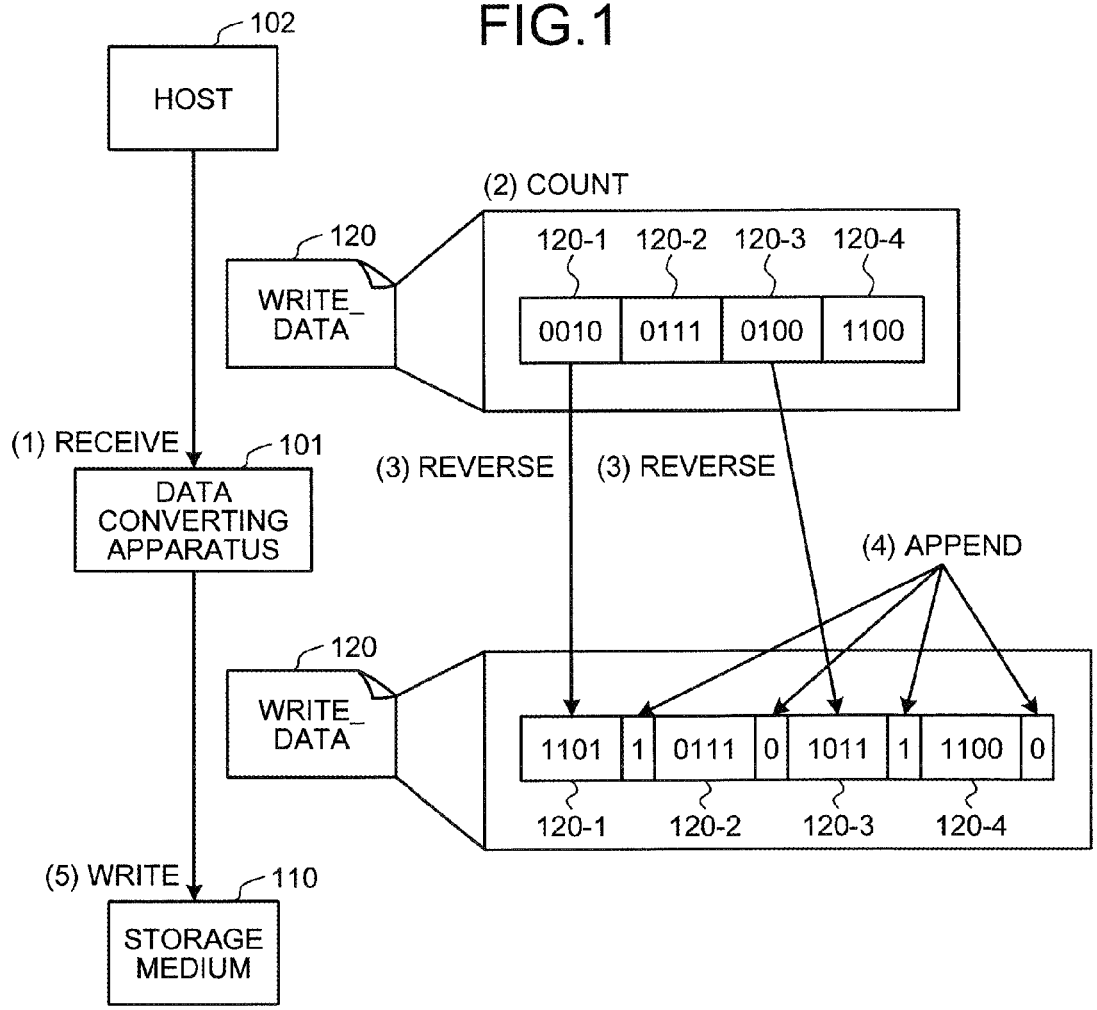
FIG. 1 is an explanatory diagram of an example of a data converting method according to a first embodiment.

FIG. 1 is an explanatory diagram of an example of a data converting method according to a first embodiment. In FIG. 1, a data converting apparatus 101 is a computer having a function of converting data written to a storage medium 110. For example, the data converting apparatus 101 is a memory controller or solid state drive (SSD) that controls the writing and reading of data with respect to the storage medium 110.

The storage medium 110 has a property that among two types of bit values stored in the storage medium 110, one value has a bit error occurrence rate higher than that of the other value. The storage medium 110, for example, is semiconductor memory, such as NAND-type flash memory.

The NAND-type flash memory expresses information in bits according to the presence/absence of charge made up of electrons accumulated in the floating gate of a memory cell. For example, the presence of charge is expressed as "0" while the absence of charge is expressed as "1".

The NAND-type flash memory also has a property that, for example, among stored bit values "0" and "1", the value "0" has a bit error occurrence rate higher than that of the value "1". For example, in the NAND-type flash memory, a bit error of turning "0" into "1" is liable to happen because of a drop in a threshold voltage for a transistor of the memory cell.

When the proportion of "0"s included in write_data exceeds 50%, the memory controller can reduce the error rate by reversing the value of each bit included in the write_data when the write_data is written to the NAND-type flash memory. The error rate represents the ratio of occurrence of bit errors to all of the write_data.

However, when the proportion of "0" and the proportion of "1" included in the write_data are nearly equal, the effect of reducing the error rate by reversing the value of each bit included in the write_data becomes smaller. For example, if the proportion of "0" included in the write_data is 51%, reversing the value of each bit included in the write_data gives the resulting proportions of "0" and "1" nearly equal to each other, resulting in a small reduction of the error rate.

According to the first embodiment, the data converting apparatus 101 performs bit reversing control in data units created by segmenting write_data written to the storage medium 110, by an arbitrary number of bits. For example, the data converting apparatus 101 counts the number of specific values included in each data selected from a group of data created by segmenting the write_data written to the storage medium 110.

The specific value is the bit value having a higher bit error occurrence rate among two kinds of bit values stored in the storage medium 110. The data converting apparatus 101 reverses the value of each bit included in the data when the counted number of specific values is more than half of the number of the total bits included in the data.

An example of a data converting process by the data converting apparatus 101 of the first embodiment will be described. In the following description, a case is assumed where the storage medium 110 has a property that among bit values "0" and "1" stored in the storage medium 110, the bit value "0" has a bit error occurrence rate higher than that of the bit value "1".

(1) The data converting apparatus 101 receives from a host 102, write_data 120 to be written to the storage medium 110. The host 102 is a computer that makes a request for writing of the write_data 120 to the storage medium 110. For example, the host 120 is a central processing unit (CPU), direct access memory controller (DMAC), graphic processing unit (GPU), or digital signal processor (DSP) incorporated in a system that includes the data converting apparatus 101 and the storage medium 110.

(2) The data converting apparatus 101 counts the number of "0"s included in each data segment selected from a group of data segments created by segmenting the received write_data 120. In the example of FIG. 1, the 16-bit write_data 120 is segmented by 4 bits into a group of data segments 120-1 to 120-4.

In this case, for example, the data converting apparatus 101 counts the number of "0"s included in each data segment of the group of data segments 120-1 to 120-4. In this example, the number of "0"s included in the data segment 120-1 is 3, the number of "0"s included in the data segment 120-2 is 1, the number of "0"s included in the data segment 120-3 is 3, and the number of "0"s included in the data segment 120-4 is 2.

(3) For each data segment of the write_data 120, the data converting apparatus 101 reverses the value of each bit included in each data segment when the counted number of "0"s included in the data is more than half of the number of the total bits included in the data segment. In the example of FIG. 1, the number of the total bits included in each data segment of the group of data segments 120-1 to 120-4 is 4.

The number of "0"s included in the data segment 120-1 is 3, which is more than half of the total number of bits "4". The data converting apparatus 101, therefore, reverses the value of each bit included in the data segment 120-1. As a result, the data segment 120-1 is converted into a data segment created by reversing the value of each bit included in the data segment 120-1.

The number of "0"s included in the data segment 120-3 is 3, which is more than half of the total number of bits "4". The data converting apparatus 101, therefore, reverses the value of each bit included in the data segment 120-3. As a result, the data segment 120-3 is converted into a data segment created by reversing the value of each bit included in the data segment 120-3.

The number of "0"s included in each of the data segments 120-2 and 120-4 is less than or equal to half the total number of bits "4". The data segments 120-2 and 120-4, therefore, are not converted.

(4) To each data segment of the write_data 120, the data converting apparatus 101 appends a reverse flag indicating whether the value of each bit included in each data has been reversed. In the example of FIG. 1, a reverse flag "1" indicating that the value of each bit has been reversed is appended to the data segment 120-1. For example, the reverse flag "1" is appended at the tail of the bit string of the data segment 120-1.

A reverse flag "0" indicating that the value of each bit has not been reversed is appended to the data segment 120-2. A reverse flag "1" indicating that the value of each bit has been reversed is appended to the data segment 120-3. A reverse flag "0" indicating that the value of each bit has not been reversed is appended to the data segment 120-4.

(5) The data converting apparatus 101 outputs to the storage medium 110, the write_data 120 to which reverse flags have been appended to each data segment of the write_data 120. As a result, the write_data 120 is written to the storage medium 110 as the write_data 120 in which the value of each bit included in the data segments 120-1 and 120-3 is reversed.

As described above, for each data segment created by segmenting the write_data 120 by an arbitrary number of bits, the data converting apparatus 101 of the first embodiment can count the number of "0"s included in each data segment. The data converting apparatus 101 can reverse the value of each bit included in the data segment when the number of "0"s included in the data segment is more than half of the number of the total bits included in the data.

As a result, bit reversing control can be performed according data units created by segmenting the write_data 120 by an arbitrary number of bits. Hence, error rate reduction is improved, compared to a case of performing bit reversing control in write_data units.

In the example of FIG. 1, the proportion of "0"s included in the write_data 120 is 0.56 ($\approx 9/16$). When bit reversing control is performed on the write_data 120 in data units created by segmenting the write_data 120 by "4" bits, the proportion of "0"s included in the write_data 120 subjected to the bit reversing is reduced to 0.3 ($\approx 5/16$). When bit reversing control is performed on the write_data 120 in write_data units, the proportion of "0"s included in the write_data 120 subjected to the bit reversing is 0.44 ($\approx 7/16$).

In this manner, bit reversing control performed in the data units created by segmenting the write_data 120 yields a lower proportion of "0"s after the bit reversal than the proportion of "0"s after bit reversal by bit reversing control performed in write_data units, and thus, improves the error rate reduction.

When the write_data 120 is read out from the storage medium 110, the data converting apparatus 101 converts each of data segments 120-1 to 120-4 of the write_data 120, based on the reverse flag appended to each data of the group of data segment 120-1 to 120-4.

For example, the converting apparatus 101 converts the value of each bit included in the data segments 120-1 and 120-3 to which the reverse flag "1" is appended. The converting apparatus 101, however, does not convert the values of the bits included in the data segments 120-2 and 120-4 to which the reverse flag "0" is appended.

When the write_data 120 is read out from the storage medium 110, therefore, the data having bits reversed at writing-in can be restored to the original state, based on the reverse flag appended to each data segment included in the write_data 120.

The data converting apparatus 101 according to a second embodiment will be described. Constituent elements identical to those described in the first embodiment are omitted in further description.

In the first embodiment, a case of performing bit reversing control in data units created by segmenting write_data by an arbitrary number of bits has been described. In the first embodiment, however, appending a reverse flag to each data increases the proportion of a redundant portion in the write_data, which may cause the capacity of the storage medium 110 to become insufficient.

For example, when the write_data is segmented by 4 bits, the size of the write_data is increased by 25% of the original data size. For example, when the write_data is segmented by 16 bits, the size of the write_data is increased by 6.3% of the original data size.

The second embodiment relates to a data converting method of reducing the error rate of the storage medium 110 and suppressing an increase in the redundant portion of write_data. An example of the data converting method of the second embodiment will hereinafter be described.

Figure 2:
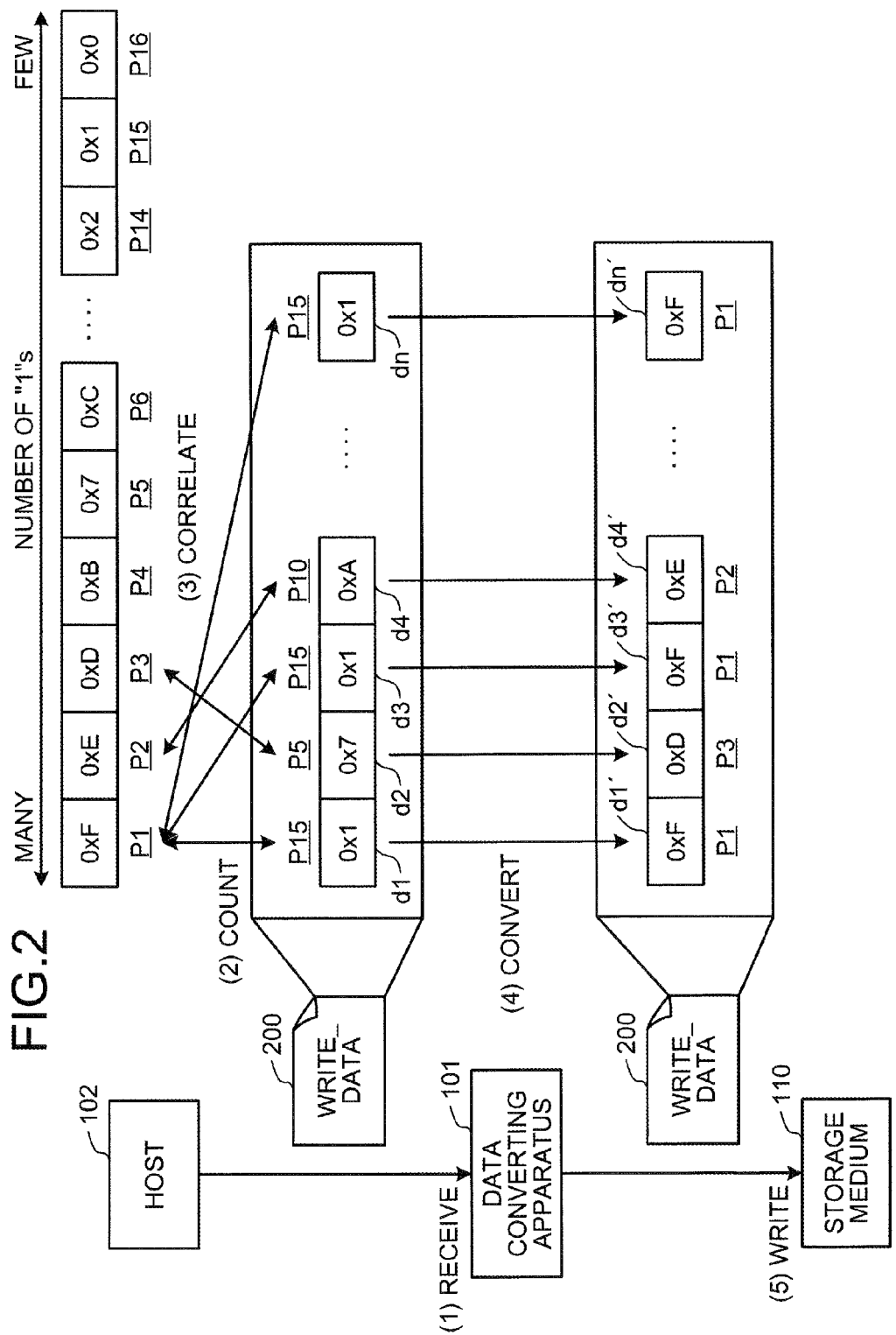
FIG. 2 is an explanatory diagram of an example of the data converting method of a second embodiment.

FIG. 2 is an explanatory diagram of an example of the data converting method of the second embodiment.

(1) The data converting apparatus 101 receives from the host 102, the write_data 200 to be written to the storage medium 110.

(2) Based on a group of data segments created by segmenting the received write_data 200 by a specific number of bits, the data converting apparatus 101 counts the number of data segments having a bit pattern P, among the group of data segments. A specific number of bits represents a data width by which the write_data 200 is segmented, and can be set arbitrarily. The specific number of bits is, for example, 4, 16, etc.

Among a group of bit patterns that a bit string composed of the specific number of bits can assume, the bit pattern P is a bit pattern that appears in the group of data segments created by segmenting the write_data 200 by a specific number of bits. A bit pattern means a pattern of a combination of bits included in a bit string.

In the following description, the group of data segments created by segmenting the write_data 200 by a specific number of bits may be expressed as "data segments d1 to dn". In the example of FIG. 2, the write_data 200 is segmented by 4 bits. The group of bit patterns the bit string composed of the specific number of bits can assume may be expressed as "bit patterns P1 to Pm". In the example of FIG. 2, because the specific number of bits is "4", bit patterns that a bit string composed of 4 bits can assume are 16 patterns including bit patterns P1 to P16. In FIG. 2, 4-bit bit strings are expressed in hexadecimal notation.

(3) The data converting apparatus 101 correlates a bit pattern that is selected as a conversion source (pre-conversion bit pattern) from among the bit patterns P1 to Pm in descending order of count results, with a bit pattern that is selected as a conversion target (post-conversion bit pattern) from among the bit patterns P1 to Pm in descending order of the number of "1"s included in the bit patterns.

For example, the data converting apparatus 101 selects, as the conversion source bit pattern, a bit pattern for which the count result is greatest among the count results for the bit patterns P1 to Pm. The data converting apparatus 101 selects a bit pattern that includes the greatest number of "1"s among the bit patterns P1 to Pm, as the conversion target bit pattern.

The data converting apparatus 101 then correlates the selected conversion source bit pattern with the selected conversion target bit pattern. The data converting apparatus 101, for example, repeatedly selects conversion source bit patterns until no bit pattern having a count result of 1 or more remains unselected among the bit patterns P1 to Pm.

In the example of FIG. 2, a case is assumed where the count result of the bit pattern P15 is the greatest, the count result of the bit pattern P10 is the second greatest, and the count result of the bit pattern P5 is the third greatest. To simplify the description, a case is assumed where bit patterns other than the bit patterns P5, P10, and P15 do not appear in the data segments d1 to dn.

In this case, the data converting apparatus 101 first selects the bit pattern P15 as the conversion source bit pattern and selects the bit pattern P1 as the conversion target bit pattern. The bit pattern P1 includes the greatest number of "1"s among the bit patterns P1 to P15. The data converting apparatus 101 correlates the selected conversion source bit pattern P15 with the selected conversion target bit pattern P1.

The data converting apparatus 101 then selects the bit pattern P10 as the conversion source bit pattern and selects the bit pattern P2 as the conversion target bit pattern. The bit pattern P2 includes the second greatest number of "1"s among the bit patterns P1 to P15. The data converting apparatus 101 correlates the selected conversion source bit pattern P10 with the selected conversion target bit pattern P2.

The data converting apparatus 101 then selects the bit pattern P5 as the conversion source bit pattern and selects the bit pattern P3 as the conversion target bit pattern. The bit pattern P3 includes the third greatest number of "1"s among the bit patterns P1 to P15. The data converting apparatus 101 correlates the selected conversion source bit pattern P5 with the selected conversion target bit pattern P3.

In this manner, the conversion source bit patterns P15, P10, and P5 selected in descending order of the frequency at which the patterns appear in the data segments d1 to dn can be correlated with the conversion target bit patterns P1, P2, and P3 selected in descending order of the number (quantity) of "1"s included in the patterns, respectively.

(4) For each conversion source bit pattern, the data converting apparatus 101 converts data segments having the conversion source bit pattern, among the data segments d1 to dn, into data segments having the conversion target bit pattern correlated with the conversion source bit pattern.

In the example of FIG. 2, for example, the data segments d1, d3, and dn each having the conversion source bit pattern P15 are converted into data segments d1', d3', and dn' each having the conversion target bit pattern P1 correlated with the conversion source bit pattern P15. The data segment d2 having the conversion source bit pattern P5 is converted into data segment d2' having the conversion target bit pattern P3 correlated with the conversion source bit pattern P5.

(5) The data converting apparatus 101 outputs to the storage medium 110, the converted write_data 200 created by converting the data segments having the conversion source bit pattern into the data segments having the conversion target bit pattern. Hence, the write_data 200 is written to the storage medium 110 as the converted data created by converting data segments having a bit pattern of which the frequency of appearance in the data segment d1 to dn is higher among the data segment di to dn into data segments having a bit pattern in which the number of "1"s is higher.

As described above, according to the data converting apparatus 101 of the first embodiment, data segments having a bit pattern of which the frequency of appearance in the data segment d1 to dn is higher can be converted into data segments having a bit pattern in which the number of "1"s is higher. As a result, the write_data 200 can be written to the storage medium 110 as write_data where each of the data segments d1 to dn has been converted into data segments in which the number of "1"s, which have a low bit error occurrence rate, becomes greater than the number of "1"s before the conversion. Hence, the error rate of the storage medium 110 can be reduced.

An example will be described, in which the data converting apparatus 101 of the second embodiment is applied to a NAND controller 302 included in a storage device 300, and the storage medium 110 is equivalent to a NAND flash memory 303.

Figure 3:
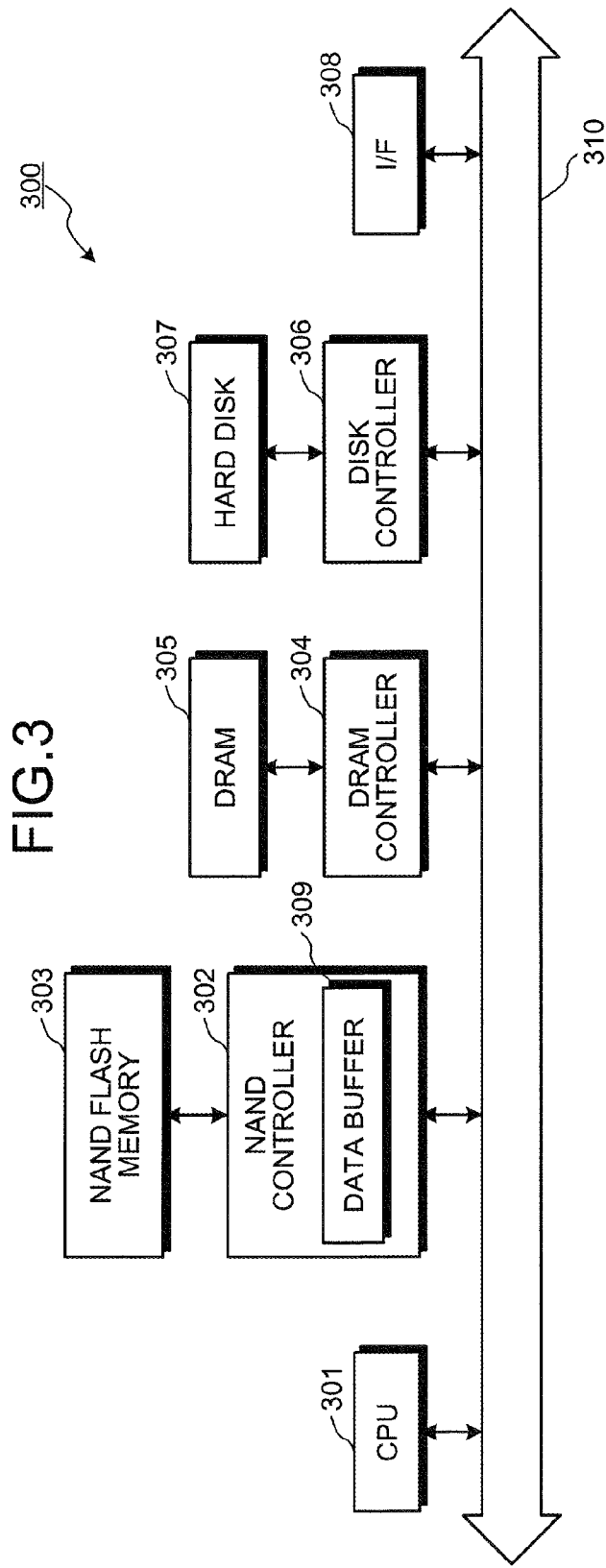
FIG. 3 is a block diagram of an example of a hardware configuration of a storage device 300.

FIG. 3 is a block diagram of an example of a hardware configuration of the storage device 300. In FIG. 3, the storage device 300 includes a CPU 301, the NAND controller 302, the NAND flash memory 303, a dynamic access random memory (DRAM) controller 304, a DRAM 305, a disk controller 306, a hard disk 307, and an interface (I/F) 308, respectively connected through a bus 310.

The CPU 301 performs overall control over the storage device 300. The NAND controller 302 controls the writing and reading of data with respect to the NAND flash memory 303. The NAND controller 302 has a data buffer 309 in which data written to/read from the NAND flash memory 303 is stored temporarily.

The NAND flash memory 303 stores data written thereto under the control of the NAND controller 302. On the NAND flash memory 303, because multiple memory cells share a conductor for driving the memory cells, data is read and written in pages. The size of a page is, for example, 4 K bytes, 8 K bytes, etc. The data buffer 309 is used for, for example, a wait process of forming data of about 32 to 256 bytes transmitted from the CPU 301, into write_data in pages. The NAND flash memory 303 stores, for example, an operation system (OS), application program, etc.

The DRAM controller 304 controls the writing and reading of data with respect to the DRAM 305. The DRAM 305 stores data written thereto under the control of the DRAM controller 304. The DRAM 305 is, for example, used as a work area for the CPU 301. The disk controller 306 controls the writing and reading of data with respect to the hard disk 307. The hard disk 307 stores data written thereto under the control of the disk controller 306.

The I/F 308 is connected to networks, such as local area network (LAN), wide area network (WAN), and the Internet, through a communication line, and is connected to an external computer through these networks. The I/F 308 supervises an internal interface between the network and the storage device 300, and controls the input and output of data with respect to an external computer. For example, a modem, LAN adaptor, etc. may be used as the I/F 308.

In the following description, write_data written in pages to the NAND flash memory 303 may be expressed as "data D". A group of data created by segmenting the data D by k bits may be expressed as "units U1 to Un", and an arbitrary unit among the units U1 to Un may be expressed as "unit Ui" (i=1, 2, ..., n). A group of bit patterns that a k-bit bit string can assume may be expressed as "bit patterns P1 to Pm", and an arbitrary bit pattern among the bit patterns P1 to Pm may be expressed as "bit pattern Pj" ($m=2^k$, j=1, 2, ..., m).

A count rule 400 used by the NAND controller 302 will be described. The count rule 400 represents a rule that is followed when among the units U1 to Un, units having the bit pattern Pj are counted. The count rule 400 will be described for a case where the data D written to the NAND flash memory 303 is segmented by 4 bits (k=4). The count rule 400 is stored in, for example, memory (not depicted) of the NAND controller 302 or the NAND flash memory 303.

Figure 4:
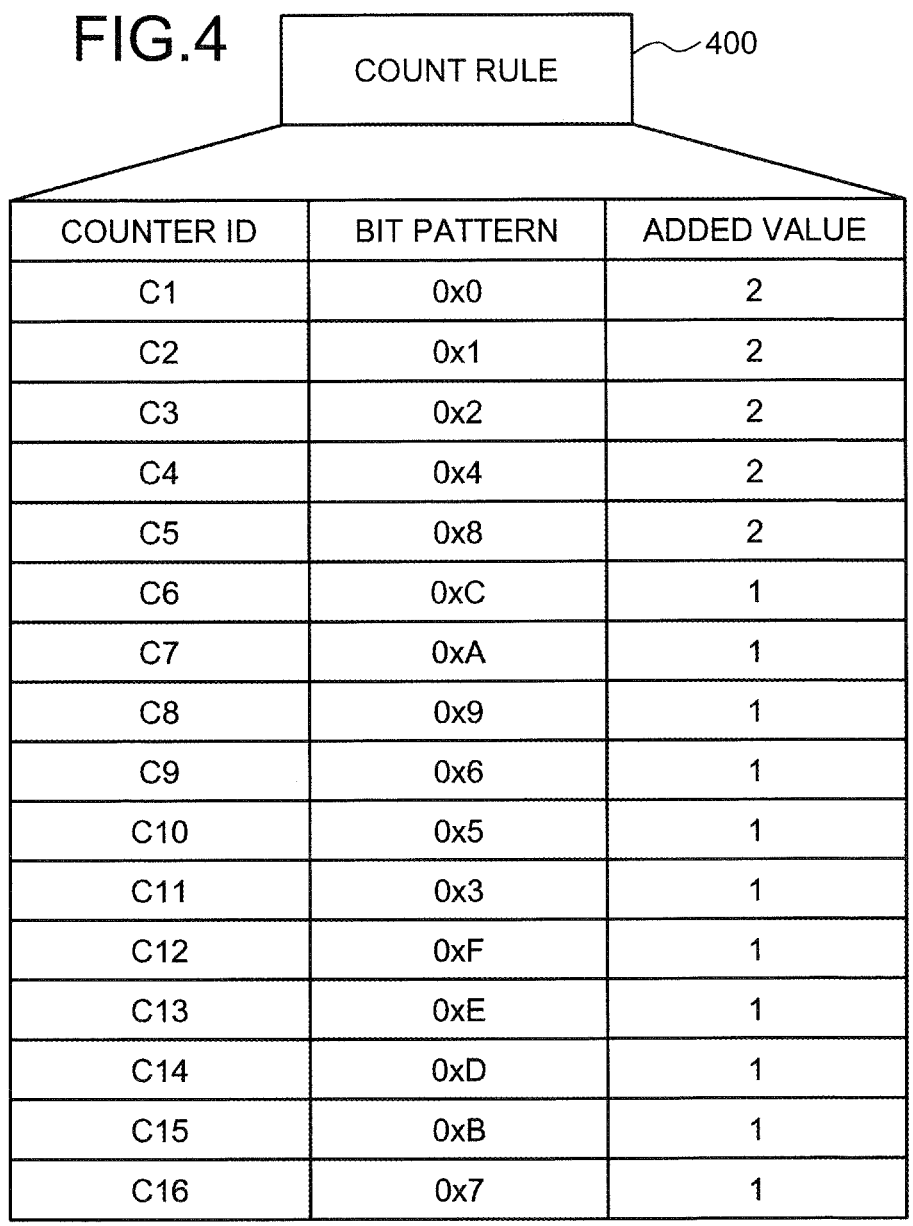
FIG. 4 is an explanatory diagram of an example of a count rule 400.

FIG. 4 is an explanatory diagram of an example of the count rule 400. In FIG. 4, the count rule 400 includes counter IDs, bit patterns, and added values that are correlated with each other. The counter IDs are identifiers for counters C1 to C16, which are incorporated in, for example, the NAND controller 302.

The bit patterns are patterns representing combinations of bits included in a 4-bit (k=4) bit string. In this example, 4-bit bit patterns are written in the hexadecimal notation. The added values are values added to the counter C1 to C16, respectively, and may be set arbitrarily.

For example, the counter C1 is a counter that counts the number of units having a bit pattern "0x0", included among the units U1 to Un. An added value for the counter C1 is "2". This means that "2" is added to the count value of the counter C1 each time a unit having the bit pattern "0x0" appears among the units U1 to Un.

For example, the counter C6 is a counter that counts the number of units having a bit pattern "0xC", included among the units U1 to Un. An added value for the counter C6 is "1". This means that "1" is added to the count value of the counter C6 each time a unit having the bit pattern "0xC" appears among the units U1 to Un.

In the following description, for convenience, 4-bit bit patterns corresponding respectively to the counters C1 to C16 may be expressed as "bit patterns P1 to P16".

A counter table 500 used by the NAND controller 302 will be described. The counter table 500 will be described for a case where the data D written to the NAND flash memory 303 is segmented by 4 bits (k=4). The counter table 500 is realized by, for example, memory (not depicted) of the NAND controller 302 or the NAND flash memory 303.

Figure 5:
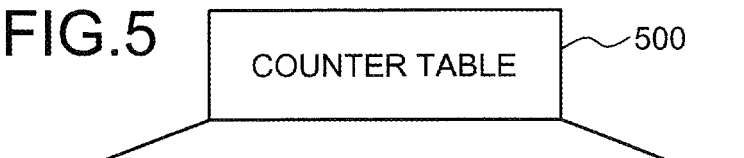
FIG. 5 is an explanatory diagram of an example of the contents of a counter table 500.

FIG. 5 is an explanatory diagram of an example of the contents of the counter table 500. In FIG. 5, the counter table 500 is a table in which respective counter values of the counters C1 to C16 are stored. In this example, the counter values of the counters C1 to C16 are written in the hexadecimal notation. For example, the counter value of the counter C1 is stored as "0x264". The respective counter values of the counters C1 to C16 are, for example, "0x000" in an initial state.

A conversion table 600 used by the NAND controller 302 will be described. The conversion table 600 is information indicating conversion source bit patterns and conversion target bit patterns correlated with each other. The conversion table 600 is made, for example, for each data D written to the NAND flash memory 303.

The conversion table 600 will be described for a case where the data D written to the NAND flash memory 303 is segmented by 4 bits (k=4). The conversion table 600 is realized by, for example, memory (not depicted) of the NAND controller 302 or the NAND flash memory 303.

Figure 6:
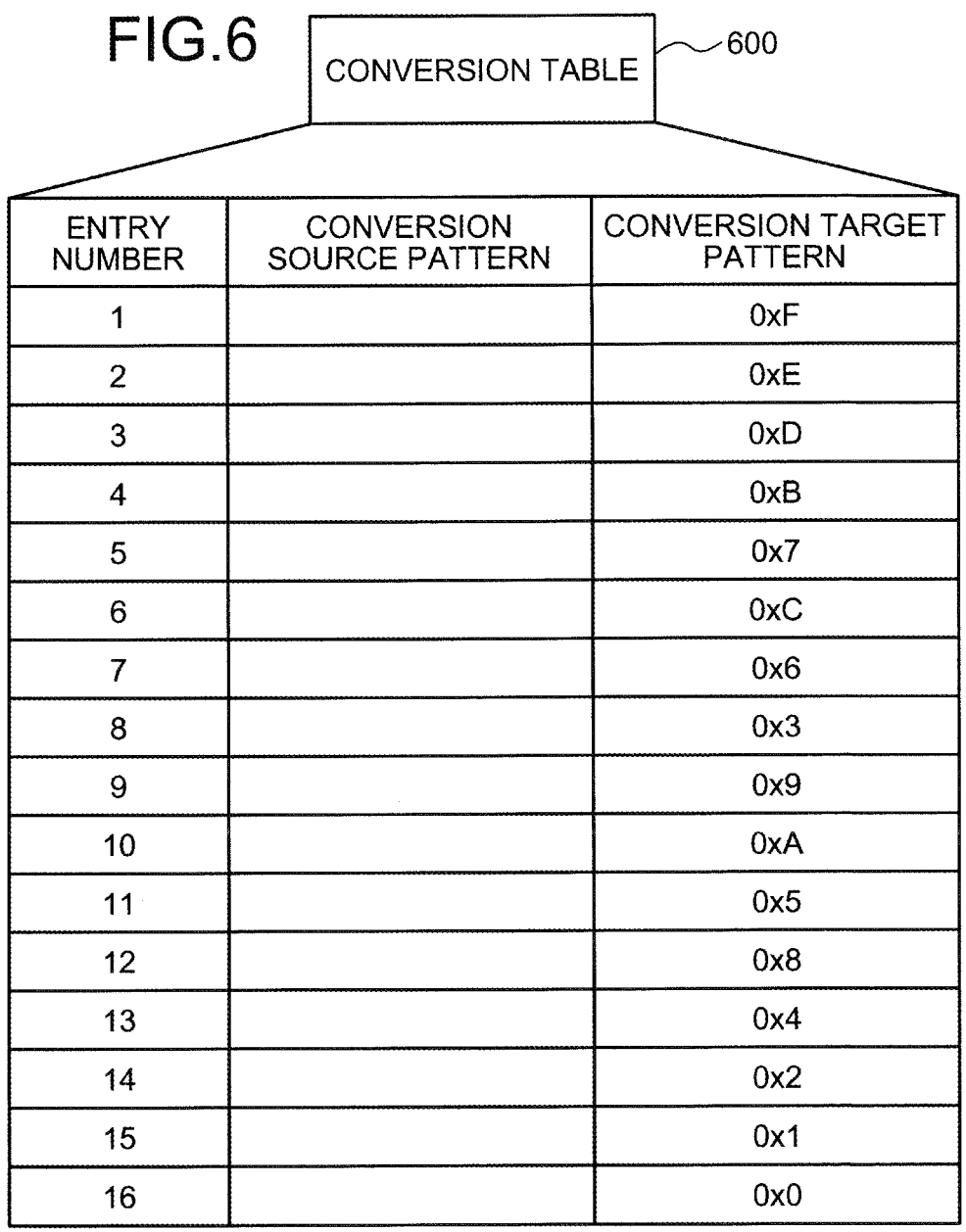
FIG. 6 is an explanatory diagram of an example of the contents of a conversion table 600.

FIG. 6 is an explanatory diagram of an example of the contents of the conversion table 600. In FIG. 6, the conversion table 600 includes fields for entry numbers, conversion source patterns, and conversion target patterns. By entering information into each field, entries 1 to 16 are each stored as a record.

An entry number is a number of an entry in the conversion table 600. A conversion source pattern is a bit pattern that is a conversion source. No value is entered into the conversion source pattern field in the initial state. A conversion target pattern is a bit pattern that is a conversion target. In the conversion target pattern fields of the respective entries in ascending order of entry number, bit patterns are entered in descending order of the number of "1"s included in the 4-bit (K=4) bit string thereof.

For example, in the conversion source pattern field for an entry 1, a bit pattern "0xF" including 4 "1"s is entered. In the conversion source pattern field for an entry 2, a bit pattern "0xE" including 3 "1"s is entered.

Figure 7:
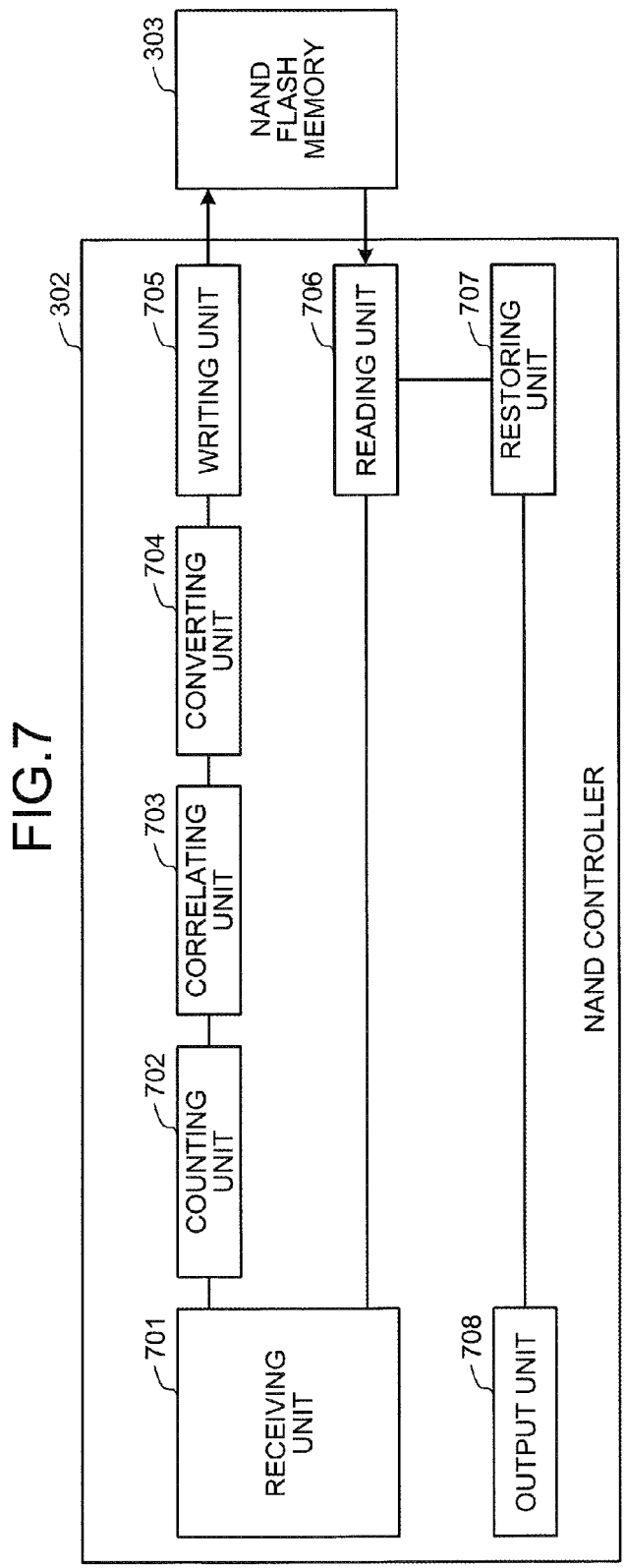
FIG. 7 is a block diagram of an example of a functional configuration of a NAND controller 302.

An example of a functional configuration of the NAND controller 302 will be described. FIG. 7 is a block diagram of an example of a functional configuration of the NAND controller 302. In FIG. 7, the NAND controller 302 includes a receiving unit 701, a counting unit 702, a correlating unit 703, a converting unit 704, a writing unit 705, a reading unit 706, a restoring unit 707, and an output unit 708.

These functional units are each realized by, for example, hardware. For example, the functional units may be formed of elements such as an AND that is a logical product circuit, INVERTER that is a not logical circuit, OR that is a logical sum circuit, and flip-flop (FF) that is a latch circuit. Each functional unit may be defined functionally by, for example, a description language, such as verilog-HDL (hardware description language), and realized by a field programmable gate array (FPGA) after logically synthesizing the functional description. The function of each functional unit may be realized by, for example, causing an arithmetic processing circuit (not depicted) of the NAND controller 302 to execute programs stored in the memory (not depicted) of the NAND controller 302 and the NAND flash memory 303.

The receiving unit 701 has a function of receiving write_data written to the NAND flash memory 303. For example, the receiving unit 701 receives data D transmitted serially from the CPU 301. The received data D is stored in, for example, the data buffer 309 of FIG. 3.

The counting unit 702 has a function of counting with respect to the units U1 to Un created by segmenting the received data D by k bits, the number of units having the bit pattern Pj, included among the units U1 to Un. For example, by using the counter Cj corresponding to the bit pattern Pj, the counting unit 702 may count the number of units having the bit pattern Pj, included among the units U1 to Un.

The counter Cj is a logical circuit that counts the number of units having the bit pattern Pj, included among the units U1 to Un. For example, the counting unit 702 selects the counter Cj corresponding to the bit pattern Pj of each unit Ui serially transmitted from the CPU 301, and increases the counter value of the counter Cj.

The counting unit 702 may count based on the data D stored in the data buffer 309, the number of units having the bit pattern Pj, included among the units U1 to Un (see FIG. 3). For example, the counting unit 702 segments the data D stored in the data buffer 309 by k bits into the units U1 to Un. The counting unit 702 then selects each unit Ui sequentially from among the resulting units U1 to Un, and increases the counter value of the counter Cj corresponding to the bit pattern of the selected unit Ui.

In this manner, the number of units having the bit pattern Pj, included among the units U1 to Un can be counted, for each bit pattern Pj appearing in the units U1 to Un among the bit patterns P1 to Pm that a k-bit bit string can assume. For each bit pattern Pj, a count result, that is, the counter value of the counter Cj, is stored to, for example, the counter table 500 of FIG. 5.

The correlating unit 703 has a function of correlating as a conversion source, a bit pattern that is selected from the bit patterns P1 to Pm in descending order of the count results of the bit patterns, with a bit pattern that is selected as a conversion target from the bit patterns P1 to Pm in descending order of the number of "1"s included in the bit patterns. Among the bit patterns P1 to Pm, bit patterns having a greater count result are bit patterns that have a higher appearance frequency, i.e., appear more frequently in the units U1 to Un.

Among the bit patterns P1 to Pm, bit patterns having a greater number of "1"s are bit patterns having a lower error rate. In other words, among the bit patterns P1 to Pm, the correlating unit 703 correlates a bit pattern of which the frequency of appearance in the units U1 to Un is higher, with a bit pattern having a lower error rate.

For example, the correlating unit 703 may make the conversion table 600 of FIG. 6 by referring to the counter table 500. An example of making the conversion table 600 will be described later with reference to FIGS. 9A and 9B.

The converting unit 704 has a function of converting among the units U1 to Un and for each conversion source bit pattern, a unit having the conversion source bit pattern, into a unit having the conversion target bit pattern correlated with the conversion source bit pattern. For example, by referring to the conversion table 600, the converting unit 704 converts a unit having a given conversion source bit pattern into a unit having the conversion target bit pattern correlated with the given conversion source bit pattern. An example of unit conversion will be described later with reference to FIGS. 9A and 9B.

In the following description, a group of converted units resulting from conversion of units among the units U1 to Un and having a conversion source bit pattern, into units having a conversion target bit pattern may be expressed as "units U1' to Un'".

The writing unit 705 has a function of writing write_data to the NAND flash memory 303. For example, the writing unit 705 may associate the converted data D with the conversion table 600 made by the correlating unit 703 and output the converted data D and conversion table 600 to the NAND flash memory 303. The converted data D represents the units U1' to Un'.

Hence, the converted data D (units U1' to Un') and the conversion table 600 associated with each other are written to the NAND flash memory 303. An example of the page format of the converted data D written to the NAND flash memory 303 will be described.

Figure 8:
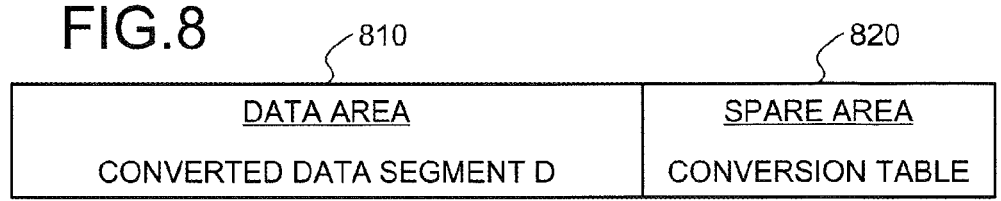
FIG. 8 is an explanatory diagram of an example of a page format.

FIG. 8 is an explanatory diagram of an example of a page format. In FIG. 8, a data area 801 and a spare area 820 are memory areas for storage in pages of the NAND flash memory 303. The data area 810 is an area to which the converted data D, i.e., units U1' to Un', is written in pages. The size of the data area is, for example, 4 KB, 8 KB, etc.

The spare area 820 is an area to which the conversion table 600 output and associated with the converted data D is written. The spare area 820 is, for example, about 5% the size of the data D. In addition to the conversion table 600, for example, error correction code (ECC), etc. may also be written to the spare area 820.

The data size of the conversion table 600 depends on the number of bit patterns ($2^k$) that a k-bit bit string can assume. In the example of FIG. 6, the number of entries in the conversion table 600 is "16(=$2^4$)", in which case, for example, if the data size of one entry is 0.5 bytes, the data size of the conversion table 600 is 8 bytes.

In this manner, by preparing in the NAND flash memory 303, the data area 810 and spare area 820 for storage in pages, the converted data D (units U1' to Un') output from the output unit 708 and the associated conversion table 600 can be stored in the NAND flash memory 303.

The reference of description returns to FIG. 7. The receiving unit 701 has a function of receiving a request for reading write_data written to the NAND flash memory 303. For example, the receiving unit 701 receives from the CPU 301, a request for reading the data D written to the NAND flash memory 303.

The reading unit 706 has a function of reading from the NAND flash memory 303, write_data for which reading is requested. For example, the reading unit 706 reads from the NAND flash memory 303, the converted data D and the associated table 600. The read converted data D and conversion table 600 are stored to, for example, the data buffer 309.

The restoring unit 707 has a function of restoring write_data read out from the NAND flash memory 303 into the original state. For example, the restoring unit 707 may restore the converted data D into the original state by referring to the conversion table 600 read together with the converted data D.

For example, the restoring unit 707 refers to the conversion table 600 using the pattern of each unit Ui' among the units U1' to Un' as a conversion target pattern, and converts each unit Ui' into a unit having the conversion source pattern corresponding to the conversion target pattern. An example of reconversion of a unit to the original state will be described later with reference to FIGS. 9A and 9B.

The output unit 708 has a function of outputting write_data restored to the original state. For example, the output unit 708 outputs to the CPU 301 that requested the reading of the data D, the data D that has been restored to the original state.

The counting unit 702 may weight the count result for a specific bit pattern among the bit patterns P1 to Pm. The specific bit pattern is, for example, the bit pattern in which the number of "1"s, which have a bit error occurrence rate that is lower than that of "0", is less than half of k bits.

For example, when the data D is segmented by 4 bits (k=4), bit patterns in which the number of "1"s is less than half of 4 bits are the bit pattern P1 "0x0", the bit pattern P2 "0x1", the bit pattern P3 "0x2", the bit pattern P4 "0x4", and the bit pattern P5 "0x8".

For example, the counting unit 702 may set an added value for each of the counters C1 to C16 by referring to the count rule 400 of FIG. 4. In the example of FIG. 4, the counter unit 702 sets an added value "2" for the counters C1 to C5 and an added value "1" for the counters C6 to C16.

As a result, for example, when a unit having a bit pattern "0x0" is received, "2" is added to the counter value for the counter C1. When a unit having a bit pattern "0xC" is received, for example, "1" is added to the counter value for the counter C6.

The counting unit 702 may weight the count result of the specific bit pattern by multiplying the counter values of the counters C1 to C5 among the counter values for the counters C1 to C16 stored in the counter table 500, by a coefficient α greater than 1. The coefficient α is, for example, 2.

Through this process, even if among the units U1 to Un, the frequency of appearance of units having the specific bit pattern is nearly equal to the frequency of appearance of units having other bit patterns, the specific bit pattern can be correlated with a bit pattern having a greater number of "1"s.

According to the above description, the writing unit 705 associates and outputs to the NAND flash memory 303, the converted data D and the conversion table 600. However, configuration is not limited hereto. For example, the writing unit 705 may associate the conversion table 600 with an identifier for the data D and store the conversion table 600 to the memory of the NAND controller 302, etc. In such a case, for example, when the converted data D is read, the restoring unit 707 refers to the conversion table 600 associated with the identifier for the data D and stored in the memory of the NAND controller 302, etc., and restores the converted data D to the original state.

The NAND controller 302 may have a function of performing bit reversing control in units created by segmenting the data D by an arbitrary number of bits. The counting unit 702 may count the number of "0"s included in each unit Ui. When the counted number of "0"s is more than half of k bits, the converting unit 704 may convert the unit Ui into a unit Ui' created by reversing the value of each bit included in the unit Ui.

When the counted number of "0"s is more than half of k bits, the writing unit 705 may associate the converted unit Ui' with a reverse flag indicating that the value of each bit included in the unit Ui has been reversed, and output the converted unit Ui' and the reverse flag to the NAND flash memory 303. When the counted number of "0"s is not more than half of k bits, the writing unit 705 may associate the unit Ui with a reverse flag indicating that the value of each bit included in the unit Ui has not been reversed, and output the unit Ui and the reverse flag to the NAND flash memory 303.

When reading the data D, the reading unit 706 may read the unit Ui' or unit Ui, and the reverse flag from the NAND flash memory 303. When the reverse flag indicates that the value of each bit has been reversed, the restoring unit 707 may convert the read unit Ui' into the unit Ui by reversing the value of each bit included in the unit Ui'.

FIGS. 9A and 9B are explanatory diagrams of an example of making the conversion table 600. Examples (a) to (e) of a specific process by the correlating unit 703 that makes the conversion table 600 by referring to the counter table 500 will hereinafter be described.

(a) The correlating unit 703 refers to the counter table 500 and selects the counter Cj having the greatest counter value among the counters C1 to C16. In the example of FIG. 5, the counter value "0xFC1" for the counter C5 is the greatest. The correlating unit 703, therefore, selects the counter C5.

(B) The correlating unit 703 enters the bit pattern P5 corresponding to the selected counter C5 into the conversion source pattern field for the entry having the lowest entry number in the conversion table 600. The bit pattern P5 corresponding to the selected counter C5 is the bit pattern "0x8". Hence, the bit pattern "0x8" is entered into the conversion source pattern field for the entry having the entry number "1".

(c) The correlating unit 703 refers to the counter table 500 and selects a counter Cj that has not yet been selected and has the greatest counter value that is 1 or larger, among the counters C1 to C16. In the example of FIG. 5, the counter value "0xB61" for the counter C3 is the second greatest. The correlating unit 703, therefore, selects the counter C3.

(d) The correlating unit 703 enters the bit pattern P3 corresponding to the selected counter C3, into the conversion source pattern field for the entry having the lowest entry number and no conversion source pattern entered yet. The bit pattern P3 corresponding to the counter C3 is the bit pattern "0x2". Hence, the bit pattern "0x2" is entered into the conversion source pattern field for the entry having the entry number "2".

(e) The correlating unit 703 repeats the processes of (c) and (d) until no unselected counter having a counter value of 1 or larger remains among the counters C1 to C16.

As a result, the bit pattern P1 "0x0" is entered into the conversion source pattern field for the entry having the entry number "3". The bit pattern P11 "0x3" is entered into the conversion source pattern field for the entry having the entry number "4". The bit pattern P2 "0x1" is entered into the conversion source pattern field for the entry having the entry number "5". The bit pattern P9 "0x6" is entered into the conversion source pattern field for the entry having the entry number "6". The bit pattern P16 "0x7" is entered into the conversion source pattern field for the entry having the entry number "7".

In this manner, among the bit patterns P1 to P16, a conversion source bit pattern that appears more frequently in the units U1 to Un can be correlated with a conversion target bit pattern having a greater proportion of "1"s, which have a bit error occurrence rate that is lower than that of "0".

An example of converting each unit Ui of the data D written to the NAND flash memory 303 using the conversion table 600 of FIGS. 9A and 9B will be described. The converting unit 704 first reads from the data buffer 309, a unit Ui among the units U1 to Un stored in the data buffer 309.

The converting unit 704 then refers to the conversion table 600 and identifies an entry having the bit pattern of the read unit Ui entered in the conversion source pattern field. Suppose, for example, the bit pattern of the read unit Ui is "0x8". In this case, the converting unit 704 refers to the conversion table 600 and identifies the entry 1, in which the bit pattern "0x8" of the read unit Ui is indicated in the conversion source pattern field.

The converting unit 704 then refers to the conversion table 600 and converts the bit pattern of the read unit Ui into the bit pattern indicated in the conversion target pattern field of the identified entry. For example, the converting unit 704 refers to the conversion table 600 and converts the bit pattern of the read unit Ui into the bit pattern "0xF" indicated in the conversion target pattern field of the identified entry 1.

The converting unit 704 repeats the above series of processes until no unread unit that has not yet been read out from the data buffer 309 remains. In this manner, among the units U1 to Un, units having conversion source bit patterns can be converted into data having conversion target bit patterns that correspond to the units having conversion source bit patterns.

An example of restoring each unit Ui of the data D read out from the NAND flash memory 303, into the original state using the conversion table 600 of FIG. 6 will be described. The restoring unit 707 first reads from the data buffer 309, a unit Ui' among the units U1' to Un' stored in the data buffer 309.

The restoring unit 707 then refers to the conversion table 600 and identifies an entry having the bit pattern of the read unit Ui' indicated in the conversion target pattern field. Suppose, for example, the bit pattern of the read unit Ui' is "0xF". In this case, the restoring unit 707 refers to the conversion table 600 and identifies the entry 1 in which the bit pattern "0xF" of the read unit Ui' is indicated in the conversion target pattern field.

The restoring unit 707 then refers to the conversion table 600 and converts the bit pattern of the read unit Ui' into the bit pattern indicated in the conversion source pattern field of the identified entry. For example, the restoring unit 707 refers to the conversion table 600 and converts the bit pattern of the read unit Ui' into the bit pattern "0x8" indicated in the conversion source pattern field of the identified entry 1.

The restoring unit 707 repeats the above series of processes until no unread unit that has not yet been read out from the data buffer 309 remains. In this manner, units having conversion target bit patterns included in the units U1' to Un' can be converted into data having conversion source bit patterns corresponding to the units having conversion target bit patterns.

Various procedures by the NAND controller 302 will be described. A writing procedure by the NAND controller 302 will first be described for a case where a request for writing of the data D to the NAND flash memory 303 is received.

Figure 10:
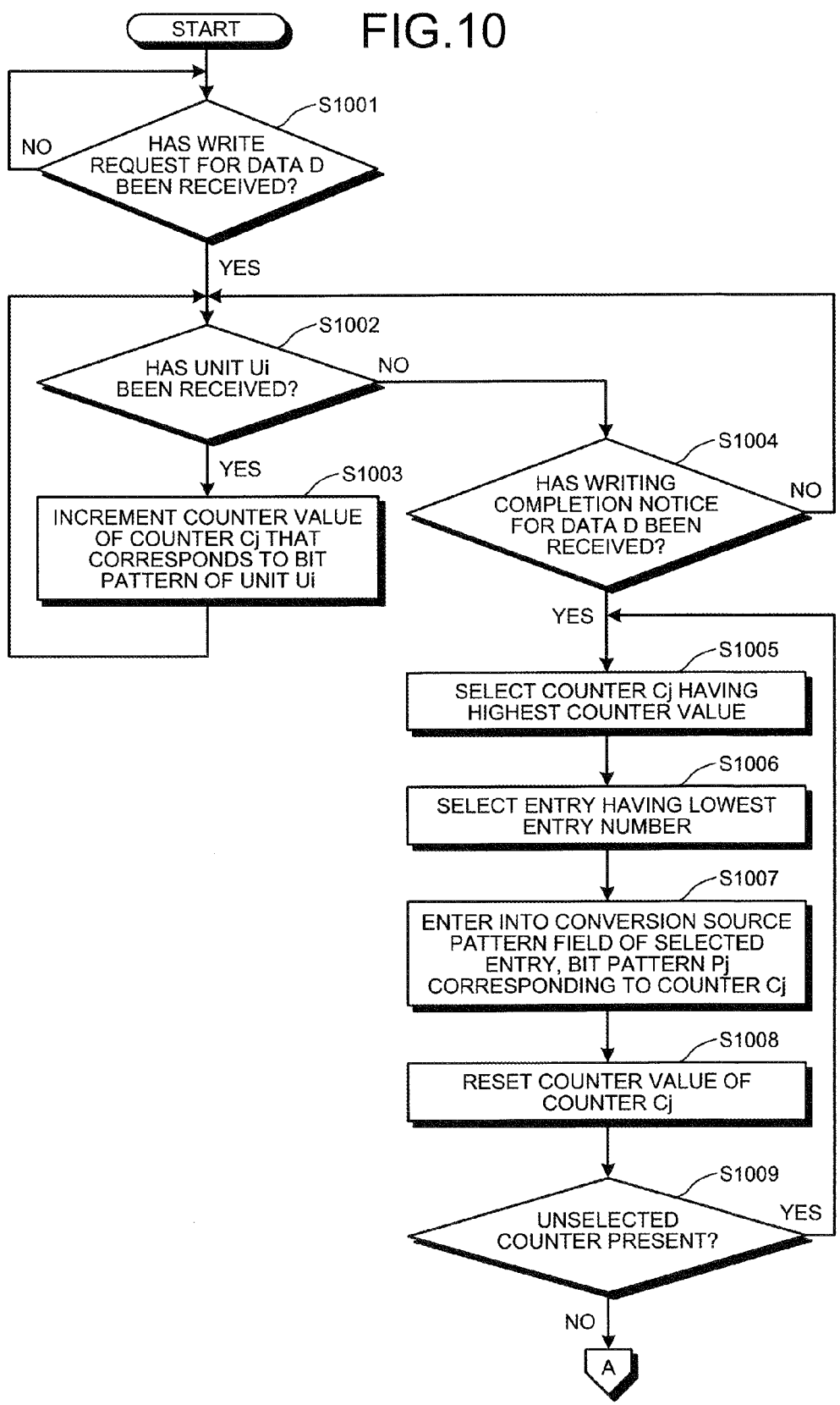

FIGS. 10 and 11 are flowcharts of an example of a writing procedure by the NAND controller 302. In the flowchart of FIG. 10, the NAND controller 302 first determines whether a write request for writing of the data D has been received from the CPU 301 (step S1001). The NAND controller 302 stands by until receiving a request for writing of the data D (step S1001: NO).

Upon receiving a request for writing of the data D (step S1001: YES), the NAND controller 302 determines whether the unit Ui created by segmenting the data D by k bits has been received (step S1002).

If the unit Ui has been received (step S1002: YES), the NAND controller 302 increases the counter value of the counter Cj that corresponds to the bit pattern of the received unit Ui (step S1003), and returns to step S1002. An added value added to the counter value of the counter Cj as an increment is, for example, an added value for the counter Cj and included in the count rule 400.

If the unit Ui is not received at step S1002 (step S1002: NO), the NAND controller 302 determines whether a notice of completion of writing the data D has been received from the CPU 301 (step S1004). If a notice of completion of writing the data D has not been received (step S1004: NO), NAND controller 302 returns to step S1002.

If a notice of completion of writing the data D has been received (step S1004: YES), the NAND controller 302 refers to the counter table 500 and selects a counter Cj that has not yet been selected and has the highest counter value (step S1005).

The NAND controller 302 selects from the conversion table 600, an entry that has not yet been selected and has the lowest entry number (step S1006). The NAND controller 302 enters the bit pattern Pj corresponding to the selected counter Cj into the conversion source pattern field of the selected entry (step S1007), and resets the counter value of the counter Cj (step S1008).

The NAND controller 302 refers to the counter table 500 and determines whether a counter that has not yet been selected and has a counter value of 1 or greater is present (step S1009). If such a counter is present (step S1009: YES), the NAND controller 302 returns to step S1005.

If no such counter is present (step S1009: NO), the NAND controller 302 proceeds to step S1101 of FIG. 11.

In the flowchart of FIG. 11, the NAND controller 302 first reads from the data buffer 309, a unit Ui that has not yet been read among the units U1 to Un stored in the data buffer 309 (step S1101).

The NAND controller 302 refers to the conversion table 600 and identifies an entry in which the conversion source pattern field indicates the bit pattern of the read unit Ui (step S1102). The NAND controller 302 refers to the conversion table 600 and converts the bit pattern of the read unit Ui into the bit pattern indicated in the conversion target pattern field of the identified entry (step S1103).

The NAND controller 302 determines whether an unread unit that has not yet been read out from the data buffer 309 is present among the units U1 to Un (step S1104). If an unread unit is present (step S1104: YES), the NAND controller 302 returns to step S1101.

If no unread unit is present (step S1104: NO), the NAND controller 302 associates the converted data D (units U1' to Un') with the conversion table 600 and outputs the converted data D and conversion table 600 to the NAND flash memory 303 (step S1105), and ends the series of operations depicted in the flowchart.

Through this procedure, the data D can be written to the NAND flash memory 303 as the converted data D in which the number of "1"s, which have a lower bit error occurrence rate, becomes greater than the number of "1"s before the data conversion. In addition, the conversion table 600 indicating the correlation between conversion source bit patterns and conversion target bit patterns can be associated with the converted data D and written to the NAND flash memory 303.

FIG. 12 is a flowchart of an example of a reading procedure by the NAND controller 302. In the flowchart of FIG. 12, the NAND controller 302 first determines whether a request for reading of the data D has been received from the CPU 301 (step S1201). The NAND controller 302 stands by until receiving a request for reading of the data D (step S1201: NO).

Upon receiving a request for reading of the data D (step S1201: YES), the NAND controller 302 reads from the NAND flash memory 303, the conversion table 600 and the converted data D (units U1' to Un') created by converting the data D for which reading has been requested (step S1202).

The NAND controller 302 then reads from the data buffer 309, an unread unit Ui' among the units U1' to Un' stored in the data buffer 309 (step S1203).

The NAND controller 302 refers to the conversion table 600 and identifies an entry in which the conversion target pattern field indicates the bit pattern of the read unit Ui' (step S1204). The NAND controller 302 refers to the conversion table 600 and converts the bit pattern of the read unit Ui' into the bit pattern indicated in the conversion source pattern field of the identified entry (step S1205).

The NAND controller 302 determines whether an unread unit that has not yet been read out from the data buffer 309 is present among the units U1' to Un' (step S1206). If an unread unit is present (step S1206: YES), the NAND controller 302 returns to step S1203.

If no unread unit is present (step S1206: NO), the NAND controller 302 outputs the restored data D (units U1 to Un) to the CPU 301 (step S1207), and ends the series of operations depicted in the flowchart.

Through this procedure, when the data D is read, the converted data D is restored to the original state, and the data D restored to the original state is output to the CPU 301.

As described above, according to the NAND controller 302 of the second embodiment, the number of units having the bit pattern Pj included among the units U1 to Un can be counted, for each bit pattern Pj appearing in the units U1 to Un, among the bit patterns P1 to Pm. The units U1 to Un are a group of data segments resulting from segmenting by k bits, the data D written in pages to the NAND flash memory 303. The bit patterns P1 to Pm are a group of bit patterns that a k-bit bit string can assume.

According to the NAND controller 302, a bit pattern that is selected as a conversion source from among the bit patterns P1 to Pm in descending order of count results can be correlated with a bit pattern that is selected as a conversion target from among the bit patterns P1 to Pm in descending order of the number of "1"s included in the bit patterns. "1" means a bit value of "1" among the bit values of "0" and "1" stored in the NAND flash memory 303. The bit value "1" has a bit error occurrence rate that is lower than that of the bit value "0".

According to the NAND controller 302, for each conversion source bit pattern, data having a conversion source bit pattern included in the units U1 to Un can be converted into data having the respective conversion target bit pattern correlated with the conversion source bit pattern. As a result, a unit having a bit pattern of which the frequency of appearance in the units U1 to Un is higher can be converted into a unit having a bit pattern in which the number of "1"s is greater. Hence, the data D written to the NAND flash memory 303 can be converted into data in which the number of "1"s, which have a lower bit error occurrence rate, is greater than the number of "1"s before the data conversion.

According to the NAND controller 302, the conversion table 600 can be made, which indicates the correlation between conversion source bit patterns and conversion target bit patterns. According to the NAND controller 302, the converted data D (units U1' to Un') can be associated with the conversion table 600 and written to the NAND flash memory 303.

As a result, the data D can be written to the NAND flash memory 303 as the converted data D in which the number of "1"s, which have a lower bit error occurrence rate, is greater than the number of "1"s before the data conversion, so that the error rate of the NAND flash memory 303 can be reduced. Even if the proportions of "0"s and "1"s included in the data D are nearly equal, the number of "1"s included in the data D can be increased efficiently by converting each unit Ui according to the frequency of appearance of the bit pattern Pj in the units U1 to Un.

The data size of the conversion table 600 depends on the number of bit patterns ($2^k$) that a k-bit bit string can assume. For example, when the data D is segmented by 4 bits, the number of entries in the conversion table 600 is "$16(=2^4)$", in which case, if the data size of one entry is 0.5 bytes, the data size of the conversion table 600 is 8 bytes.

For example, when the data size of the data D for storage in pages is 4 K bytes, the proportion of a redundant portion of the data D is about 0.2% (8 bytes/4096 bytes). In this manner, according to the NAND controller 302, the proportion of the redundant portion of the data D can be reduced, compared to, for example, a case of performing bit reversing control by adding a reverse flag to each data unit.

According to the NAND controller 302, when the converted data D is read out from the NAND flash memory 303, the converted data D can be restored to the original state by referring to the conversion table 600 stored in association with the converted data D.

According to the NAND controller 302, the count result for a specific bit pattern among the bit patterns P1 to Pm can be weighted. The specific bit pattern is, for example, the bit pattern in which the number of "1" having a bit error occurrence rate lower than that of "0" is less than half of k bits.

As a result, even if the frequency of appearance of the specific bit pattern is nearly equal to the frequency of appearance of other bit patterns, the specific bit pattern can be correlated with a bit pattern in which the number of "1"s is greater. Hence, the number of "1"s included in the data D can be increased efficiently.

According to the NAND controller 302 of the second embodiment, therefore, the error rate of the data D written to the NAND flash memory 303 can be reduced. According to the NAND controller 302, reducing the error rate of the data D prevents an increase in the number of bits making up error correction code used for ECC and thereby, prevents an increase in the circuit scale of the NAND controller 302 and in the memory capacity of the NAND flash memory 303.

According to the NAND controller 302, the proportion of "1"s included in the data D increases when the data D is written in, thereby suppressing power consumption that occurs when electric charge is drawn out from the floating gate to delete the data D, and shortens the time consumed for deleting the data. According to the NAND controller 302, shortening the time for deleting the data D improves access performance of the NAND flash memory 303 and extends the life of the NAND flash memory 303.

The data converting method described in the present embodiment may be implemented by executing a prepared program on a computer such as a personal computer and a workstation. The program is stored on a computer-readable recording medium such as a hard disk, a flexible disk, a CD-ROM, an MO, and a DVD, read out from the computer-readable medium, and executed by the computer. The program may be distributed through a network such as the Internet.

The data converting apparatus 101 described in the present embodiment can be realized by an application specific integrated circuit (ASIC) such as a standard cell or a structured ASIC, or a programmable logic device (PLD) such as a field-programmable gate array (FPGA). Specifically, for example, functional units of the NAND controller 301 are defined in hardware description language (HDL), which is logically synthesized and applied to the ASIC, the PLD, etc., thereby enabling manufacture of the NAND controller 301.

According to one aspect of the present invention, an effect of reducing the error rate of a storage medium is achieved.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A data converting method executed by a computer, the data converting method comprising:
   counting for each bit pattern that appears in a group of data segments and is among a group of bit patterns that a bit string of a specific number of bits assume, the number of data segments in the group of data segments, having the bit pattern, the group of data segments being created by segmenting write_data by the specific number of bits, the write_data being written to a storage medium having a property that among two types of bit values stored in the storage medium, a first value has a bit error occurrence rate that is higher than that of a second value;
   correlating a bit pattern that is selected as a conversion source pattern, from the group of bit patterns in descending order of count results obtained at the counting, with a bit pattern that is selected as a conversion target pattern, from the group of bit patterns in descending order of quantities of the second value included in the bit patterns, respectively; and
   converting for each conversion source bit pattern, data segments included in the group of data segments and having the conversion source bit pattern, into converted data segments having the conversion target bit pattern correlated with the conversion source bit pattern.

2. The data converting method according to claim 1 and further comprising:
   making correlation information indicating correlation between each conversion source bit pattern and conversion target bit pattern correlated with each other; and
   associating and outputting the converted data segments with the correlation information to the storage medium.

3. The data converting method according to claim 2 and further comprising:
   acquiring the converted data segments and the correlation information from the storage medium; and
   determining based on the acquired correlation information, the bit pattern of each converted data segment included among the converted data segments to be a conversion target bit pattern and converting each of the converted data segments into a restored data segment having the conversion source bit pattern correlated with the conversion target bit pattern.

4. The data converting method according to claim 1, wherein the counting includes weighting the count result of a bit pattern in which the quantity of the second value is less than half of the specific number of bits.

5. A data converting method executed by a computer, the data converting method comprising:
   counting a number of first values included in each data segment selected from a group of data segments created by segmenting write_data that is written to a storage medium having a property that among two types of bit values stored in the storage medium, the first value has a bit error occurrence rate that is higher than that of a second value; and
   reversing each bit value included in a data segment to obtain a converted data segment, when the number of the first values included in the data segment is more than half the number of total bits included in the data segment.

6. The data converting method according to claim 5 and further comprising:
   associating and outputting to the storage medium, the converted data segment with reverse information indicating that each bit value included in the converted data segment has been reversed, when the number of the first values included in the converted data segment is more than half the number of total bits in the converted data segment; and
   associating and outputting to the storage medium, the data segment with reverse information indicating that each bit value included in the data segment has not been reversed, when the number of the first values included in the data segment is not more than half the number of total bits in the data segment.

7. The data converting method according to claim 6 and further comprising:
   acquiring the converted data segment and the reverse information from the storage medium; and
   converting the acquired converted data segment into a restored data segment created by reversing each bit value included in the converted data segment, when the acquired reverse information indicates that the value of each bit has been reversed.

8. A data converting apparatus comprising:
a counting unit that for each bit pattern that appears in a group of data segments and is among a group of bit patterns that a bit string of a specific number of bits assume, counts the number of data segments in the group of data segments, having the bit pattern, the group of data segments being created by segmenting write_data by the specific number of bits, the write_data being written to a storage medium having a property that among two types of bit values stored in the storage medium, a first value has a bit error occurrence rate that is higher than that of a second value;
a correlating unit that correlates a bit pattern that is selected as a conversion source pattern, from the group of bit patterns in descending order of count results obtained by the counting unit, with a bit pattern that is selected as a conversion target pattern, from the group of bit patterns in descending order of quantities of the second value included in the bit patterns, respectively; and
a converting unit that for each conversion source bit pattern, converts data segments included in the group of data segments and having the conversion source bit pattern, into converted data segments having the conversion target bit pattern correlated with the conversion source bit pattern.

9. The data converting apparatus according to claim 8, wherein
the correlating unit makes correlation information indicating correlation between each conversion source bit pattern and conversion target bit pattern correlated with each other, and
the data converting apparatus further comprising a writing unit that associates and outputs the converted data segments with the correlation information to the storage medium.

10. The data converting apparatus according to claim 9 and further comprising:
a reading unit that acquires the converted data segments and the correlation information from the storage medium; and
a restoring unit that determines based on the acquired correlation information, the bit pattern of each converted data segment included among the converted data segments to be a conversion target bit pattern and restores each of the converted data segments into a restored data segment having the conversion source bit pattern correlated with the conversion target bit pattern.

11. The data converting apparatus according to claim 8, wherein the counting unit weights the count result of a bit pattern in which the quantity of the second value is less than half of the specific number of bits.

12. A data converting apparatus comprising:
a counting unit that counts a number of first values included in each data segment selected from a group of data segments created by segmenting write_data that is written to a storage medium having a property that among two types of bit values stored in the storage medium, the first value has a bit error occurrence rate that is higher than that of a second value; and
a converting unit that converts a data segment into a converted data segment by reversing each bit value included in the data segment, when the number of the first values included in the data segment is more than half the number of total bits included in the data segment.

13. The data converting apparatus according to claim 12 and further comprising:
a writing unit that associates and outputs to the storage medium, the converted data segment with reverse information indicating that each bit value included in the converted data segment has been reversed, when the number of the first values included in the converted data segment is more than half the number of total bits in the converted data segment, wherein
the writing unit associates and outputs to the storage medium, the data segment with reverse information indicating that each bit value included in the data segment has not been reversed, when the number of the first values included in the data segment is not more than half the number of total bits in the data segment.

14. The data converting apparatus according to claim 13 and further comprising:
a reading unit that acquires the converted data segment and the reverse information from the storage medium; and
a restoring unit that restores the acquired converted data segment into a restored data segment created by reversing each bit value included in the converted data segment, when the acquired reverse information indicates that the value of each bit has been reversed.

* * * * *